US012751254B2

(12) United States Patent
Hsu

(10) Patent No.: US 12,751,254 B2
(45) Date of Patent: Sep. 29, 2026

(54) SYSTEM AND METHOD FOR CONTROLLING CHEMICAL MECHANICAL PLANARIZATION

(71) Applicant: Taiwan Semiconductor Manufacturing Co., Ltd., Hsinchu (TW)

(72) Inventor: Chun-Wei Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1000 days.

(21) Appl. No.: 17/185,857

(22) Filed: Feb. 25, 2021

(65) Prior Publication Data

US 2022/0270939 A1 Aug. 25, 2022

(51) Int. Cl.
*H10P 74/00* (2026.01)
*B24B 37/00* (2012.01)
(Continued)

(52) U.S. Cl.
CPC .............. *H10P 74/23* (2026.01); *B24B 37/00* (2013.01); *B24B 37/005* (2013.01); *B24B 37/042* (2013.01); *B24B 37/34* (2013.01); *B24B 49/12* (2013.01); *B24B 51/00* (2013.01); *G06T 7/001* (2013.01); *H10P 52/402* (2026.01);
(Continued)

(58) Field of Classification Search
CPC ..... B24B 7/228; B24B 37/005; B24B 37/042; B24B 37/32; B24B 37/345; B24B 49/00; B24B 49/10; B24B 49/12; B24B 49/183; B24B 41/005; H01L 22/20; H01L 21/30625; G06T 2207/20081; G06T 2207/20084; G06T 2207/30148
USPC ................. 451/5, 6, 8–11, 41, 54, 285, 287, 451/332–335, 339, 397, 398
See application file for complete search history.

(56) References Cited

U.S. PATENT DOCUMENTS 11,571,786 B2 * 2/2023 Osterheld ............. B24B 53/017
2002/0127852 A1 * 9/2002 Kawakami ............. C23C 16/54 438/689
(Continued)

FOREIGN PATENT DOCUMENTS

CN 208744423 U 4/2019
CN 111098226 A 5/2020
(Continued)

*Primary Examiner* — Makena S Markman
(74) *Attorney, Agent, or Firm* — Seed IP Law Group

(57) ABSTRACT

A chemical mechanical planarization system includes a chemical mechanical planarization head configured to hold a semiconductor wafer during a chemical mechanical planarization process. The system includes a camera positioned to capture an image of the chemical mechanical planarization after chemical mechanical planarization has unloaded the semiconductor wafer. A control system analyzes the image to determine if the chemical mechanical planarization head is damaged. If the chemical mechanical planarization head is damaged, the control system prevents further chemical mechanical planarization operations until the chemical mechanical planarization head is repaired. If the control system does not detect any damage, then the control system permits the chemical mechanical planarization head to receive a next semiconductor wafer for chemical mechanical planarization.

20 Claims, 8 Drawing Sheets

(51) Int. Cl.

| | |
|---|---|
| ***B24B 37/005*** | (2012.01) |
| ***B24B 37/04*** | (2012.01) |
| ***B24B 37/34*** | (2012.01) |
| ***B24B 49/12*** | (2006.01) |
| ***B24B 51/00*** | (2006.01) |
| ***G06T 7/00*** | (2017.01) |
| ***H10P 52/40*** | (2026.01) |

(52) U.S. Cl.
CPC ............... *G06T 2207/20081* (2013.01); *G06T 2207/20084* (2013.01); *G06T 2207/30148* (2013.01)

(56) References Cited

U.S. PATENT DOCUMENTS

2005/0130562 A1* 6/2005 Nabeya .................. B24B 49/12 451/6
2007/0243796 A1* 10/2007 Torii ....................... B24B 37/32 451/41
2010/0035516 A1* 2/2010 Takahashi ............ B24B 37/013 451/5
2017/0291274 A1* 10/2017 Shinozaki .............. B24B 37/30
2019/0283209 A1* 9/2019 Osterheld ............ B24B 53/017
2020/0130134 A1 4/2020 Chen et al.
2020/0298368 A1* 9/2020 Osterheld ............ B24B 49/186
2022/0270939 A1* 8/2022 Hsu ...................... B24B 37/042
2024/0078659 A1* 3/2024 Ofir ........................... G06T 5/77
2024/0234153 A1* 7/2024 Kim ...................... B24B 53/017

FOREIGN PATENT DOCUMENTS

| | | | |
|---|---|---|---|
| CN | 111936267 | A | 11/2020 |
| JP | 6660636 | B2 | 3/2020 |
| JP | 2020189366 | A | 11/2020 |
| KR | 20130102699 | A | 9/2013 |
| TW | 201938321 | A | 10/2019 |
| TW | 202017032 | A | 5/2020 |

* cited by examiner

SYSTEM AND METHOD FOR CONTROLLING CHEMICAL MECHANICAL PLANARIZATION

BACKGROUND

Technical Field

The present disclosure relates to the field of chemical mechanical planarization.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate. Accordingly, many semiconductor processes and techniques have been developed to decrease the size of features in integrated circuits.

Chemical mechanical planarization is a process that has enabled the use of thin film materials that enable features of relatively small size. Chemical mechanical planarization can planarize the surface of a semiconductor wafer after thin film deposition and patterning processes. Chemical mechanical planarization utilizes chemical and mechanical processes to planarize the semiconductor wafer. While highly beneficial, chemical mechanical planarization can also be susceptible to equipment failure resulting in damaged semiconductor wafers.

DETAILED DESCRIPTION

Figure 1:
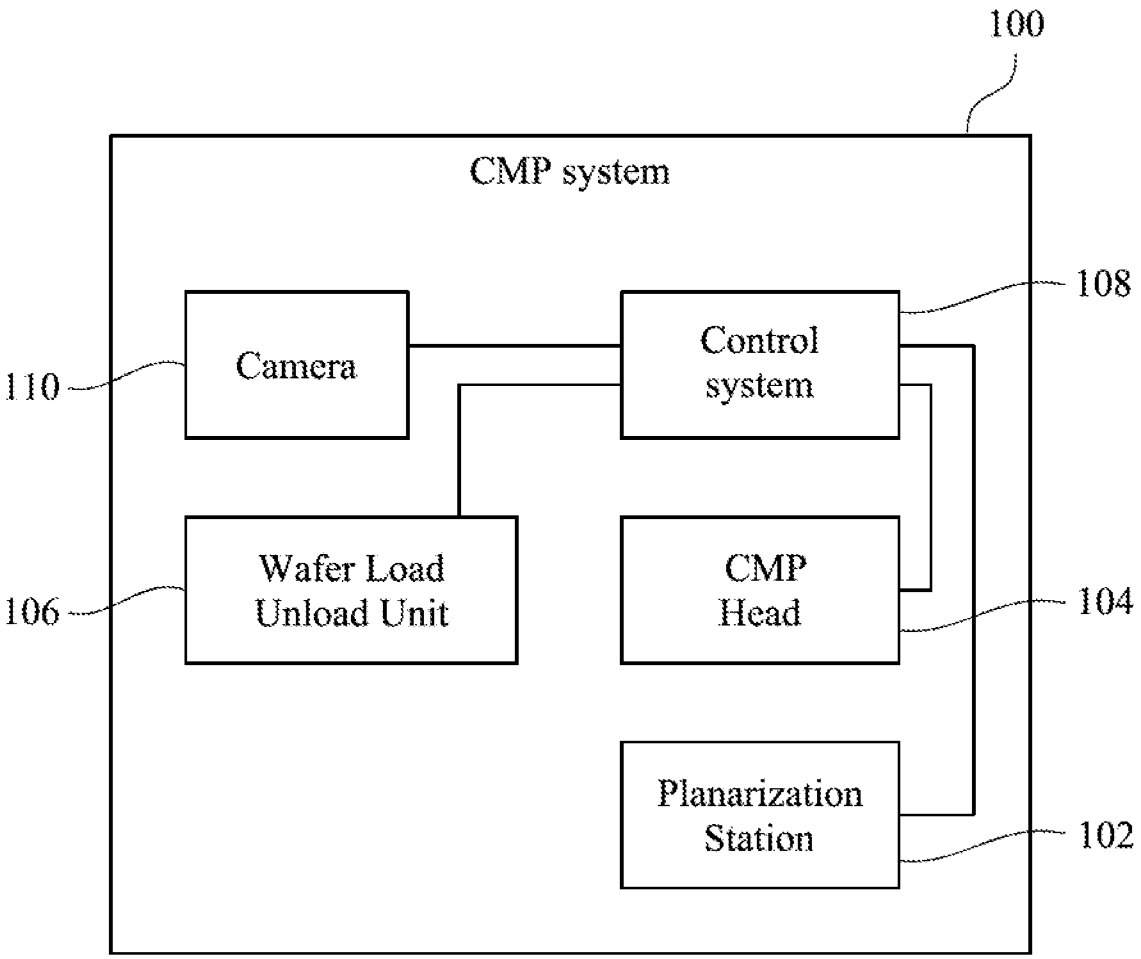
FIG. 1 is a block diagram of a chemical mechanical planarization system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits over traditional chemical mechanical planarization systems. Embodiments of the present disclosure utilize an image capturing system and machine learning techniques to detect damage or other flaws in chemical mechanical planarization equipment before the equipment can damage a semiconductor wafer. Embodiments of the present disclosure reduce the need for technicians or experts to stop operation of the chemical mechanical planarization equipment in order to manually inspect chemical mechanical planarization equipment. Instead, the image capture system and machine learning modules can detect damaged equipment during operation and can automatically stop operation if damage is detected. The result is that fewer resources are utilized in inspecting and operating chemical mechanical planarization equipment. Furthermore, fewer expensive semiconductor wafers will need to be scrapped due to damaged chemical mechanical planarization equipment.

FIG. 1 is an illustration of a chemical mechanical planarization (CMP) system 100, according to one embodiment. The CMP system 100 includes one or more planarization stations, one or more CMP heads, a wafer load and unload unit 106, a control system 108, and a camera 110. The components of the CMP system 100 cooperate to provide an efficient CMP process that detects equipment damage before a semiconductor wafer can be damaged by the equipment.

In one embodiment, during a CMP process, a semiconductor wafer (not shown in FIG. 1) is transferred to the wafer load and unload unit 106 by a transfer system. The wafer load and unload unit 106 receives the semiconductor wafer and ensures that the semiconductor wafer is positioned for pickup. Typically, the wafer load and unload unit 106 receives the semiconductor wafer face down such that a surface to be planarized is facing downward.

In one embodiment, after the wafer load and unload unit 106 has received and positioned the semiconductor wafer for pickup, a CMP head 104 picks up the wafer from the wafer load and unload unit 106. The CMP head 104 typically holds the semiconductor wafer face down such that the surface to be planarized is facing downward and is exposed. The CMP head 104 may hold the semiconductor wafer by a pressure differential that prevents the semiconductor wafer from falling downward.

In one embodiment, the CMP head 104 includes a retaining ring, not shown in FIG. 1. The retaining ring laterally surrounds the circumference of the semiconductor wafer when the semiconductor wafer is held by the CMP head 104. The retaining ring prevents the semiconductor wafer from moving laterally during planarization.

After the semiconductor wafer has been loaded into the CMP head 104, the CMP head 104 moves to a planarization station 102. The planarization station 102 performs a planarization processes on the semiconductor wafer in conjunction with the CMP head 104. The planarization station 102 includes a circular horizontal surface covered by a CMP pad. The planarization station 102 also includes a slurry delivery system and a pad conditioning system. During the planarization process, the horizontal surface and the CMP pad are rotated. The CMP head 104 also rotates. The slurry delivery system delivers a liquid slurry material onto the rotating pad. The rotating CMP head 104 presses the downward facing surface of the semiconductor wafer onto the rotating pad. The rotating pad and the slurry material planarized the surface of the semiconductor wafer by mechanically and chemically removing protruding features from the surface of the semiconductor wafer. In this way, the CMP system 100 planarized is a surface of a semiconductor wafer.

In practice, the CMP head 104 may travel between multiple planarization stations 102. A planarization processes performed on the semiconductor wafer at each planarization station 102. After the CMP head 104 has carried the semiconductor wafer to each planarization station 102, the CMP process is complete for that semiconductor wafer.

In one embodiment, after the CMP process is complete, the CMP head 104 carries the semiconductor wafer to the wafer load and unload unit 106. The CMP head 104 positions the semiconductor wafer directly over the wafer load and unload unit 106 and lowers the semiconductor wafer onto the wafer load and unload unit 106. The CMP head 104 then releases the semiconductor wafer into the wafer load and unload unit 106. The transfer system then retrieves the semiconductor wafer from the wafer load and unload unit 106. The transfer system then transfers a new semiconductor wafer to the wafer load and unload unit 106, the CMP head 104 retrieves the semiconductor wafer, and the CMP process is performed again.

It is possible that during the previous CMP process, the CMP head 104 has become damaged. The damage can include cracks, scratches, or even more substantial breakage in the CMP head 104. If the CMP head 104 takes part in another CMP process, then it is possible that the semiconductor wafer can become damaged. If the semiconductor wafer is damaged, is possible that the semiconductor wafer will have to be scrapped. In some cases, individual integrated circuit die diced from the semiconductor wafer will be nonfunctional, resulting in problems for users of the integrated circuit. In any of these cases, scrapping, fixing, or replacing damaged wafers or integrated circuits can be extremely costly in terms of human, computing, and monetary resources.

In some cases, the restraining ring of the CMP head 104 becomes damaged. The damage to the restraining ring can result from debris from a CMP pad during the CMP process, from crystallization of slurry materials on the restraining ring, or from scratches from diamond components of the CMP pad.

One approach to addressing the damage is to manually stop the CMP system 100 so that a human technician, expert, or engineer can visually examine the restraining ring or other parts of the CMP head 104. Typically the individual enters the CMP load and unload area and examines the CMP head 104 with a flashlight in order to detect any damage. If a human checks the CMP head 104 after each CMP process, then this results in a large delay in the CMP processes. If a human checks the CMP head 104 only periodically after a selected number of CMP processes, then it is possible that a damaged CMP head 104 will go undetected for a large number of CMP processes. In this case, a large number of semiconductor wafers may be damaged in between checks. One additional problem is that even very minor damage to the CMP head 104 can result in damage to semiconductor wafers. Such minor damage is often difficult or impossible to detect by mere observation by a human. Accordingly, even very frequent inspection of the CMP head 104 may not be able to prevent damage to semiconductor wafers during CMP processes.

The CMP system 100 overcomes these problems by utilizing the camera 110 and the control system 108. The camera 110 is positioned to capture images of the CMP head 104 after the CMP head 104 has deposited the semiconductor wafer on the wafer load and unload unit 106 and before the CMP head 104 has received a new semiconductor wafer from the wafer load and unload unit 106. The camera 110 captures pictures of the CMP head 104 from a position below the CMP head 104. Accordingly, the camera 110 captures images of the bottom of the CMP head 104.

In one embodiment, the CMP system 100 utilizes multiple cameras 110. Each of the cameras 110 can capture images of the CMP head 104 from various angles. There can be one or more cameras 110 positioned to capture images of the CMP head 104 from various angles below the CMP head 104. There can be one or more cameras positioned to capture images of the CMP head 104 from positions substantially lateral to the CMP head 104. There can be one or more cameras 110 positioned to capture images of the CMP head 104 from various angles above the CMP head 104.

In one embodiment, one or more of the cameras 110 are positioned to capture images of the restraining ring of the CMP head 104. One or more cameras 110 can capture images of a bottom surface of the restraining ring. One or more cameras 110 can capture images of an interior restraining surface of the restraining ring. The interior restraining surface can be the surface that laterally surrounds the lateral edges of the semiconductor wafer during the CMP process.

The camera 110 passes the images to the control system 108. The control system 108 analyzes the images in order to detect damage to the CMP head 104. The control system 108 can utilize image processing techniques to compare the CMP head 104, or components of the CMP head 104, to reference images of an undamaged CMP head, or components of an undamaged CMP head. If there are differences between images of the CMP head 104 and the reference images, then the control system 108 can determine that the CMP head 104 is damaged.

In one embodiment, the CMP head 104 includes an analysis model that has been trained with one or more machine learning processes to detect damage to the CMP head 104. The machine learning process can train the analysis model to accurately identify when the CMP head 104, or particular components of the CMP head 104, are damaged. Further details regarding the machine learning process are provided in relation to FIG. 4.

In one embodiment, the control system 108 controls the function of the CMP system 100. The control system 108 can be communicatively coupled to the CMP head 104, the wafer load and unload unit 106, and to the planarization stations 102. The control system 108 can control the function of these components. The control system 108 can activate or deactivate the components of the CMP system 100.

In one embodiment, if the control system 108 detects damage to the CMP head 104, then the control system 108 can stop the CMP processes before another semiconductor wafer is loaded into the wafer load and unload unit 106. Accordingly, upon detecting damage to the CMP head 104 based on images captured by the camera 110, the control system 108 can prevent a next CMP process from happening. Thus, the damaged CMP head 104 will not be used in another CMP process until the damage component has been replaced or repaired. In this way, no semiconductor wafers will be damaged in CMP processes outside of the CMP process that initially damage the CMP head 104.

It is possible that a semiconductor wafer that was loaded in the CMP head 104 during the process that damaged the CMP head 104 will have sustained damage during the CMP process. However, no further semiconductor wafers will be damaged by the CMP head 104 because the camera 110 and the control system 108 cooperate to detect damage to the CMP 104 the real time before another CMP process can be performed. Accordingly, the CMP system 100, in accordance with principles of the present disclosure, greatly reduces the number of semiconductor wafers that may be damaged.

Figure 2:
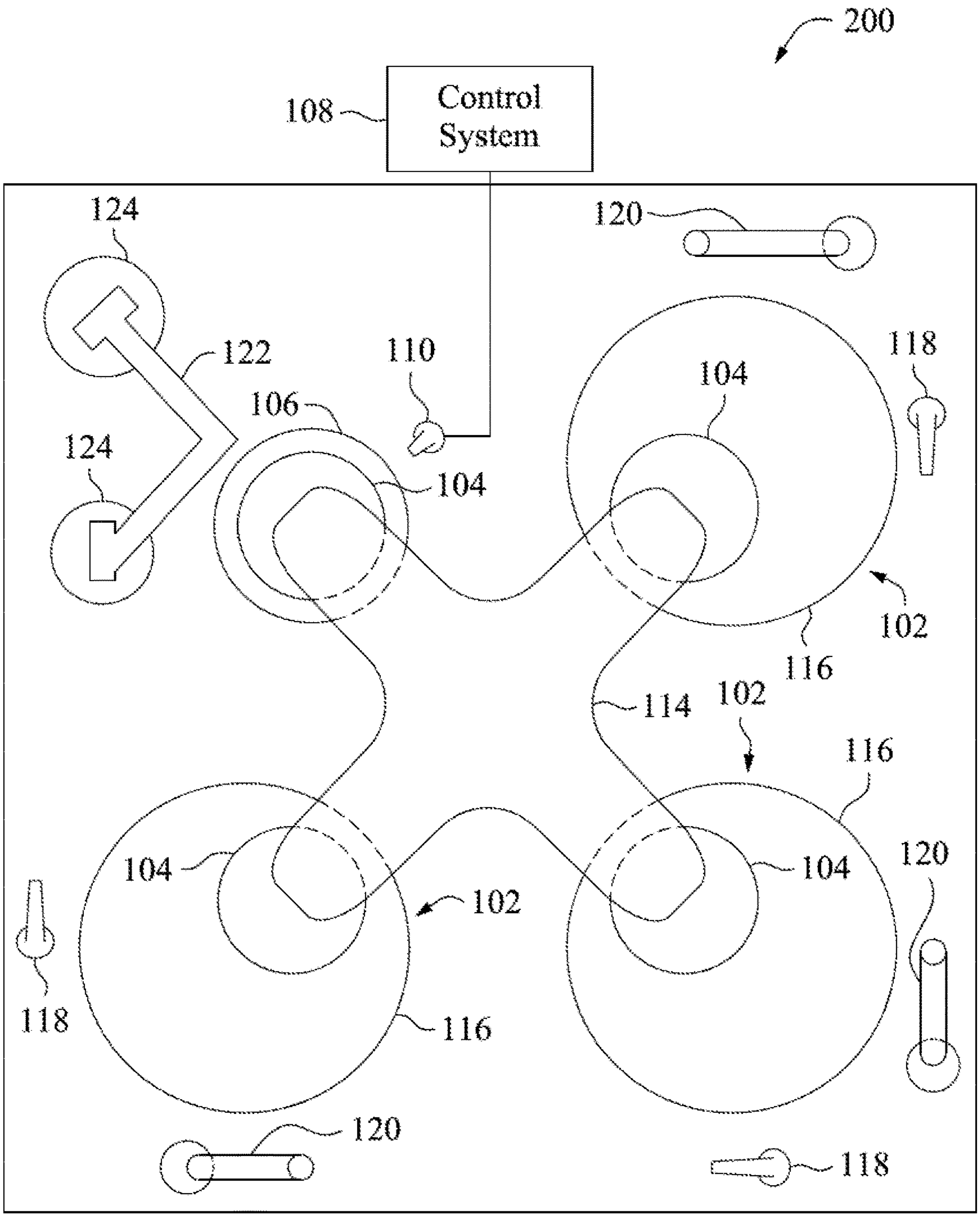
FIG. 2 is an illustration of a chemical mechanical planarization system, according to one embodiment.

FIG. 2 is a top view of a CMP system 200, according to one embodiment. The CMP system 200 includes a frame 114, a wafer load and unload unit 106, and three planarization stations 102. The CMP system 200 also includes a camera 110 and a control system 108.

In the example of FIG. 2, the frame 114 is coupled to four CMP heads 104. The CMP heads 104 are each connected to the frame 114 by a respective shaft (not visible in the top view of FIG. 2). The shaft can enable and drive rotation of the CMP head 104. The shaft can also raise and lower the CMP head 104 relative to the frame of 114. Alternatively, the frame 114 itself can be raised and lowered. The frame 114 can rotate in order to move the CMP heads 104 between the wafer load and unload unit 106 and the various planarization stations 102.

In one embodiment, each planarization station 102 includes a CMP pad 116 positioned on a circular platen (not visible in the top view of FIG. 2). Each planarization station 102 includes a respective slurry supply arm 118 and a respective pad conditioner 120.

The three planarization stations 102 facilitate simultaneous processing of multiple wafers in a short time. During operation of the CMP system 200, the platens rotate, thereby rotating the CMP pads 116. During operation, the slurry supply arms 118 are positioned over the CMP pads 116. The slurry supply arms 118 supply a slurry onto the CMP pads 116. During operation, the pad conditioners 120 are swept over the respective CMP pads 116 for conditioning of the CMP pads 116. In particular, the pad conditioners 120 includes a rotating head that rotates while in contact with the rotating CMP pad 116. The head conditions the rotating CMP pad 116.

In one embodiment, a robot arm 122 delivers a wafer 124 to the wafer load and unload unit 106. A CMP head 104 is lowered onto the wafer load and unload unit 106 in order to retrieve the wafer from the wafer load and unload unit 106. As described previously in relation to FIG. 1, the CMP head 104 can hold the semiconductor wafer 124 via a combination of pressure and a lateral retaining ring. Further details of the lateral retaining ring will be shown in relation to FIGS. 3A and 3B.

After the CMP head 104 retrieves a semiconductor wafer from the wafer load and unload unit 106, the frame 114 rotates clockwise to position the CMP head 104 over a first planarization station 102. The CMP head 104 presses the exposed surface of the semiconductor wafer 124 downward onto the rotating pad 116. The CMP head 104 may itself rotate the semiconductor wafer 124. The pad conditioner 120 conditions the CMP pad 116. The slurry supply arm 118 supply slurry onto the rotating pad 116. After this process is complete, the frame 114 again rotates counterclockwise to position the CMP head 104 over the next planarization station 102 and the planarization process is repeated. The frame 114 again rotates clockwise to position the CMP head 104 over the next planarization station 102 and the planarization process is repeated.

After the CMP head 104 has carried the semiconductor wafer 124 to each planarization station 102, the frame 114 is rotated clockwise again to position the CMP head 104 over the wafer load and unload unit 106. The CMP head 104 delivers the planarized semiconductor wafer 124 to the wafer load and unload unit 106. The robot arm 122 retrieves the planarized semiconductor wafer 124 from the wafer load and unload unit 106.

The CMP system 200 includes a camera 110. The camera 110 is positioned adjacent to the wafer load and unload station 106. After the CMP head 104 has delivered the planarized semiconductor wafer 124 to the wafer load and unload station 106, the camera 110 captures one or more images of the CMP head 104. As described in relation to FIG. 1, the camera 110 may be positioned to capture an image from below the CMP head 104. There may be multiple cameras 110 positioned in various locations to capture images of various aspects of the CMP head 104.

The control system 108 analyzes the images of the CMP head 104 in order to determine if the CMP head 104 has been damaged. The control system 108 can include image processing modules or systems configured to analyze the images of the CMP head 104. If the control system 108 detects damaged to a component of the CMP head 104, then the control system 108 stops operation of the CMP system 200 until the CMP head 104 can be replaced or repaired. Further details regarding the control system 108 are provided in relation to FIG. 4.

FIG. 2 illustrates one example of a CMP system 200. A CMP system 200 can include different components, different arrangements of components, and different functions without departing from the scope of the present disclosure.

Figure 3A:
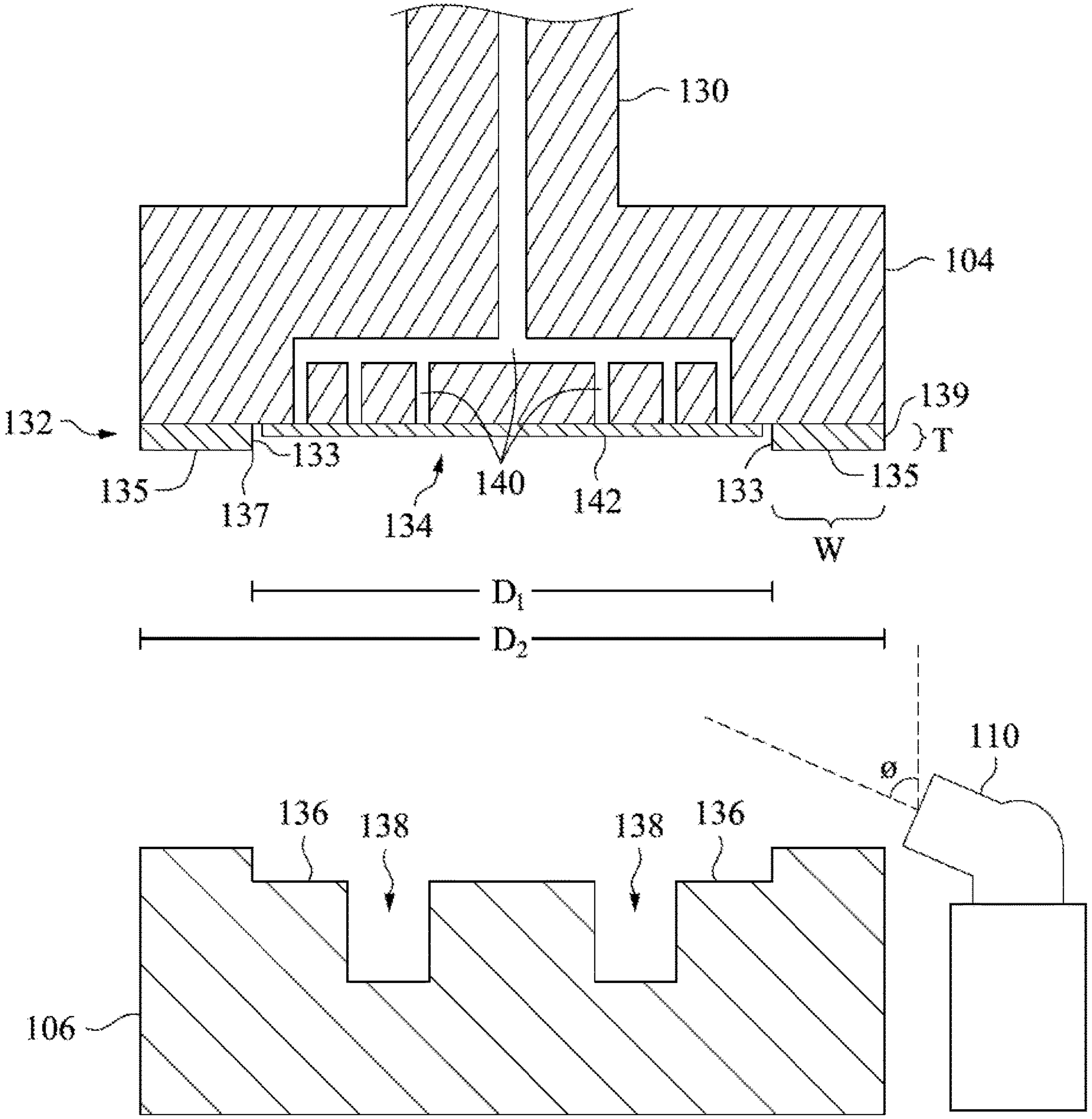
FIG. 3A is a side sectional view of a chemical mechanical planarization head, according to one embodiment.

FIG. 3A is a simplified side sectional view of a CMP head 104 positioned above a wafer load and unload unit 106. A semiconductor wafer 124 is not shown in FIG. 3A. The CMP head 104 includes a retainer ring 132 coupled to a bottom portion of the CMP head 104. The CMP head 104 is coupled to the frame 114 (see FIG. 2) by a shaft 130.

The CMP head 104 includes air passages 140 and the flexible membrane 142. An air passage 140 extensor the shaft 130 and branches into a plurality of air passages 140 that extends to the flexible membrane 142. Though not shown in FIG. 3A, the flexible membrane 142 includes a plurality of smaller air passages or pores. A vacuum system in the frame 114 or elsewhere can pump the air through the air passages 140 after the shaft 130 in order to generate a vacuum in the air passages 140 and in the course of the flexible membrane 142.

When the CMP head 104 is ready to receive a wafer from the wafer load and unload unit 106, the CMP head 104 is lowered to the wafer load and unload unit 106 which holds a wafer (not shown in FIG. 3A). When the flexible membrane 142 is positioned near and directly above the wafer, the vacuum system activates a generative vacuum in the air passages 140 and in the pores of the flexible membrane 142. The result is that the wafer is held by the flexible membrane 142 by vacuum suction. Likewise, when the CMP head 104 is ready to deliver a wafer to the wafer load and unload unit 106 after a CMP process, the vacuum system removes a vacuum condition in the wafer is no longer held against the flexible membrane 142. The wafer is released onto the wafer load and unload unit 106.

In one embodiment, the retainer ring 132 includes an interior surface 133 and a bottom surface 135. The interior surface 133 defines a gap 134. When the CMP head 104 retrieves a semiconductor wafer from the wafer load and unload unit 106, the semiconductor wafer 124 is held in the gap 134 defined by the interior surface 133 of the retaining ring 132. The CMP head 104 holds the semiconductor wafer 124 and the vertical direction via an air pressure differential, as described above. The CMP head 104 holds the semiconductor wafer 124 in the lateral direction via the retainer ring 132. In particular, the interior surface 133 of the retainer ring 132 laterally surrounds and restrains the semiconductor wafer 124 when the semiconductor wafer 124 is positioned in the gap 134.

In one embodiment, the wafer load and unload unit includes a shelf 136. When a semiconductor wafer 124 is loaded into the wafer load and unload unit 106, the semiconductor wafer 124 rests on the shelf 136. The CMP head 104 can be lowered to retrieve a semiconductor wafer 124 from the wafer load and unload unit 106.

In one embodiment, the wafer load and unload unit 106 includes gaps or channels 138. Cleaning fluids can be output from the gaps 138 to clean the CMP head 104. Accordingly, the wafer load and unload unit 106 can include fluid nozzles positioned in the gaps 138. The fluid nozzles can output a cleaning fluid to clean the CMP head 104 before the robot arm 122 (see FIG. 2) delivers the next semiconductor wafer 124 to the wafer load and unload unit 106. Accordingly, in one embodiment, the wafer load and unload unit 106 is a Head Clean Load/Unload (HCLU) unit.

The retainer ring 132 defines an inner diameter D1. The inner diameter D1 corresponds to the diameter of the interior surface 133 of the retainer ring 132. In one embodiment, the inner diameter is between 302 mm and 305 mm. In this case, the CMP head 104 may be configured to hold a 300 mm wafer. The inner diameter D1 of the retainer ring 132 can be based on the size of wafer that the CMP head 104 is designed to hold. Furthermore, the Inner diameter D1 can have values other than that described above without departing from the scope of the present disclosure.

The retainer ring 132 defines an outer diameter D2. The outer diameter D2 corresponds to the diameter of the outer surface 139. In one embodiment, the outer diameter D2 is between 329 mm and 335 mm, in the case of a CMP head 104 designed to hold 300 mm wafers. The outer diameter D2 can have different values without departing from the scope of the present disclosure. Furthermore, the outer diameter D2 may vary based on the size of wafer that the CMP head 104 is designed to hold.

The retainer ring 132 has a thickness T. The thickness T corresponds to the distance between the bottom surface 135 and the surface of the CMP head 104 to which the retainer ring 132 is attached. In one example, the retainer ring 132 has a thickness T between 31 mm and 35 mm. The retainer ring 132 can have other thicknesses without departing from the scope of the present disclosure.

During CMP operations, the bottom surface 135 of the retainer ring 132 contacts the CMP pad 116 at a planarization station 102 (see FIG. 2). If either the bottom surface 135 or the interior surface 133 is damaged during operation, then the semiconductor wafer 124 may be damaged in subsequent CMP operations. In order to detect damage to the bottom surface 135 or the interior surface 133 of the retainer ring 132, a camera 110 is positioned adjacent to the wafer load and unload unit 106 below the CMP head 104. The camera 110 is configured to capture images of the CMP head 104 from an angle below the CMP head 104. The camera 110 is configured to pass the images to the control unit (see FIG. 2).

Typically, an area of the retainer ring 132 that is susceptible to damage is near a corner where the interior surface 133 meets the bottom surface 135. If this area of the retainer ring 132 is damaged, it is likely that a semiconductor wafer held by the retainer ring 132 will be damaged during a CMP process. Damage to the retainer ring 132 may be difficult to detect with the human eye.

FIG. 3A illustrates a damaged area 137 of the retainer ring 132. The damaged area 137 is at a location where the interior surface 133 meets the bottom surface 135. In practice, the damaged area 137 may occur at the junction of the interior surface 133 and the bottom surface 135, on the interior surface 133, on the bottom surface 135, or on both the interior surface 133 and the bottom surface 135 depending on the extent of the damage.

In one embodiment, the camera 110 is configured to capture images of the area of the retainer ring 132 at which the interior surface 133 meets the bottom surface 135. Because the retainer ring 132 is circular, the camera 110 can capture images along the inner circumference of the retainer ring 132 to detect if any portion of the retainer ring 132 has sustained damage.

In one embodiment, the camera 110 is positioned with an angle Θ relative to vertical. The angle Θ can be selected so that the camera 110 can capture images of a selected portion of the retainer ring 132. Because, in one example, it is desirable to obtain images of both the interior surface 133 and the bottom surface 135, the camera 110 can be positioned to capture images of the interior surface 133 a bottom surface 135 and a portion of the interior surface 133 and bottom surface 135 opposite to the lateral position of the camera 110. In one example, the angle Θ is selected to be between 45° and 70° relative to vertical, though other angles can be selected based on the position of the camera 110 and the portion of the retainer ring 132 to be photographed. When there are multiple cameras 110, the cameras can out the same angle Θ or different angles Θ in accordance with their position and the desired portions of the retainer ring 132 can be captured.

In one embodiment, the control system 108 can cause the CMP head 104 to rotate so that the camera 110 can capture images along the entire inner circumference of the retainer ring 132. The control system 108 can cause the CMP head 104 to rotate in a stepwise manner such that the CMP head 104 periodically stops so that the camera 110 can capture an image. The CMP head 104 can make a full rotation in this manner until the camera 110 is captured images along the entire inner circumference of the retainer ring 132. Capturing images of the entire Inner circumference of the retainer ring 132 can include capturing images of the interior surface 133, the bottom surface 135, the area where the interior surface 133 meets the bottom surface 135, or both the interior surface 133 and the bottom surface 135. In one embodiment, the CMP head 104 can rotate in a continuous manner while the camera 110 captures images until the CMP head 104 has made a full rotation and the camera 110 is captured images along the entire interior surface 133 and bottom surface 135 of the retainer ring 132.

In one embodiment, the camera 110 can pivot or otherwise move to capture images all along the desired surface or surfaces of the retainer ring 132. For example, the camera 110 can capture an image of the retainer ring at one location, then rotate or move to capture images of another location of the retainer ring 132. The camera 110 can move until images have been captured of all desired locations. In this case, the camera 110 may be positioned at a location directly below the CMP head 104 so that the camera 110 can capture images of the entire inner surface 133, bottom surface 135, or the area where the inner surface 133 meets the bottom surface 135.

In one embodiment, there may be multiple cameras 110 positioned below the CMP head. The cameras 110 can be configured to capture images of the CMP head from a plurality of angles from below the CMP head 104. The various images can be utilized by the control system 108 to detect damage to the CMP head 104.

In one embodiment, the camera 110 is configured to capture images of the retainer ring 132. The purpose of this is to enable the control system 108 to determine if the retainer ring 132 has been damaged during a planarization process. If the control system 108 detects damage to the retainer ring 132, the control system 108 can stop operation of the CMP system until the retainer ring 132 has been replaced.

In one embodiment, the camera 110 may be positioned within the wafer load and unload unit 106. For example, the camera 110 may be positioned in a gap 138 in the wafer load and unload unit 106. While the camera 110 shown in FIG. 3A is much larger than the gaps 138, in practice, the camera 110 can be small enough to be positioned within the wafer load and unload unit 106.

A CMP head 104 can include other components, arrangements of components, or structure other than not shown in FIG. 3A without departing from the scope of the present disclosure. In particular, a CMP head 104 may include various components for generating the pressure differential that holds a semiconductor wafer 124 within the gap 134 during CMP operations. Additionally, a wafer load and unload unit 106 may include other components, arrangements of components, or structure than shown in FIG. 3A without departing from the scope of the present disclosure.

Figure 3B:
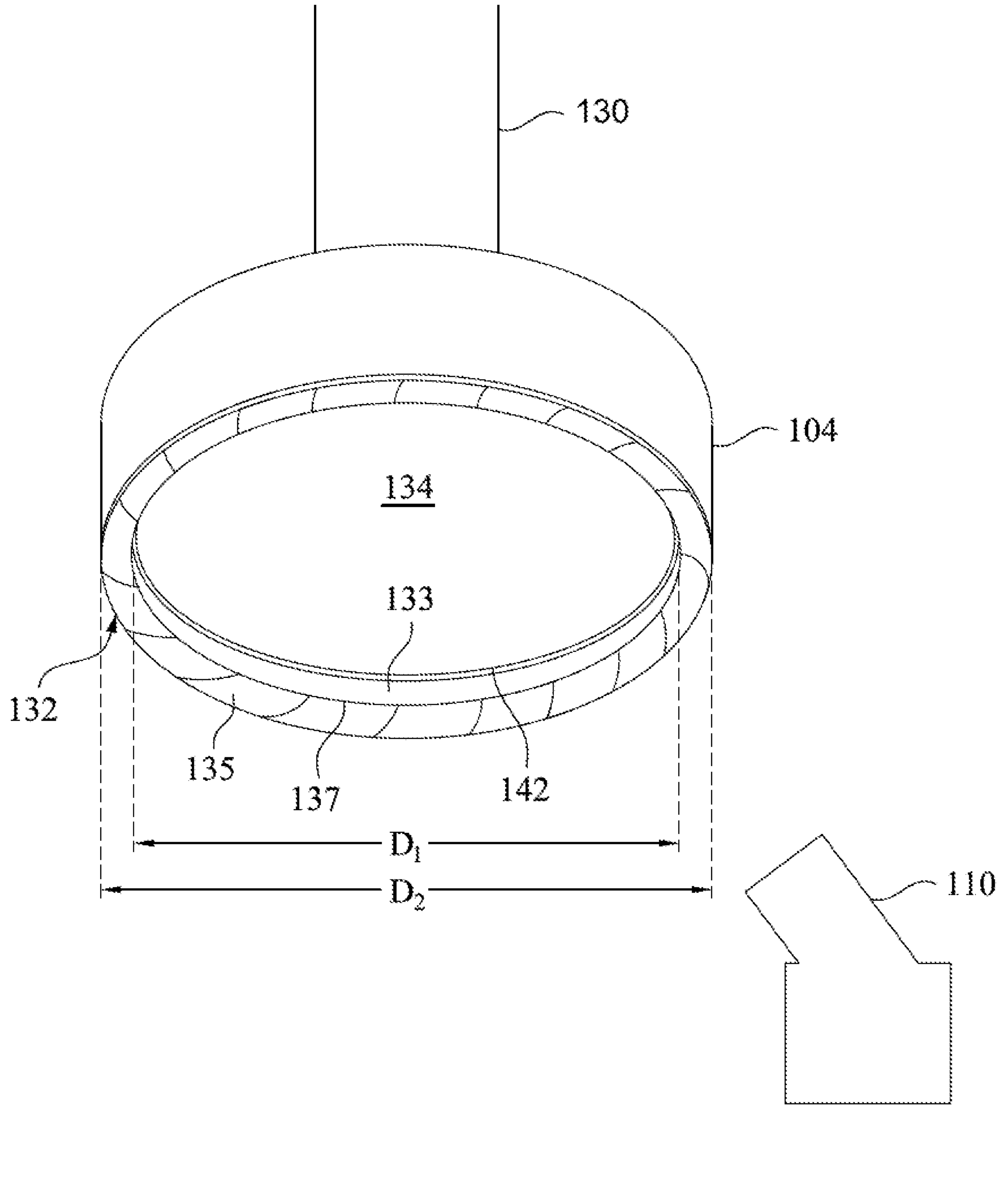
FIG. 3B is bottom perspective view of the chemical mechanical planarization head of FIG. 3A, according to one embodiment.

FIG. 3B is a bottom perspective view of the CMP head 104 of FIG. 3A, according to one embodiment. The CMP head 104 includes a retaining ring 132. The interior surface 133 of the retaining ring 132 laterally bounds the semiconductor wafer 124 (not shown in FIG. 3B) when the semiconductor wafer 124 is held by the CMP head 104. The bottom surface 135 contacts the CMP pad 116 of a planarization station 102 (see FIG. 2) during a CMP operation. The camera 110 may be positioned to capture images of the bottom surface 135 and the interior surface 133 of the retaining ring 132.

The view of FIG. 3B illustrates a damage location 137 on the interior surface 133 near where the interior surface 133 meets the bottom surface 135. This is a common location for damage to occur to the retainer ring 132. Accordingly, the camera 110, or cameras 110 are able to capture images that focus on the interior surface 133, the bottom surface 135, or where the interior surface 133 meets the bottom surface 135.

Figure 4:
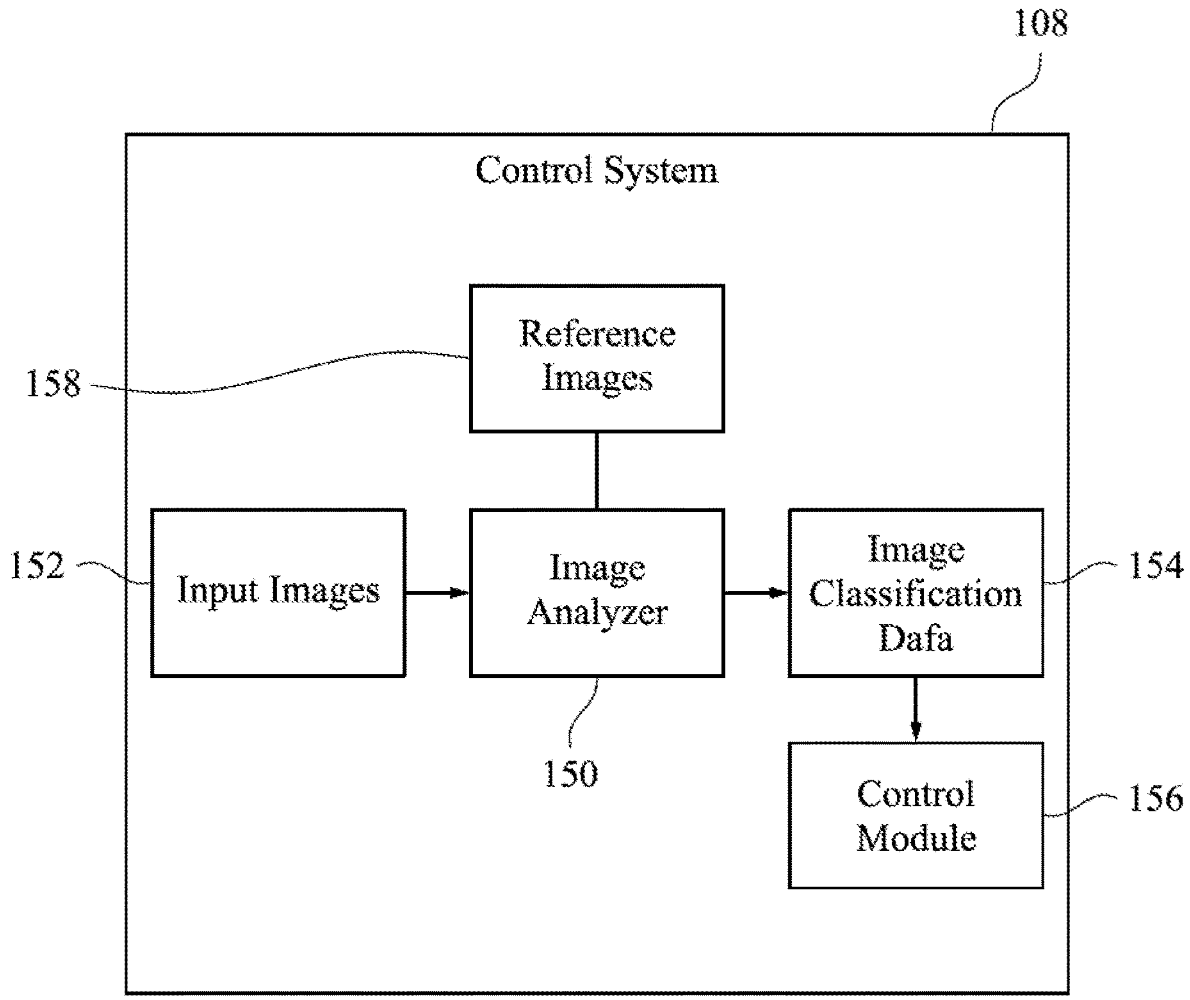
FIG. 4 is a block diagram of a control system of a chemical mechanical planarization system, according to one embodiment.

FIG. 4 is a block diagram of a control system 108, according to one embodiment. The control system 108 is part of a CMP system. The control system 108 can control components of the CMP system 110 to activate or deactivate CMP processes. The control system 108 is coupled to a camera 108 (see FIGS. 1-3B) and this configured to receive images from the camera 108. The control system 108 analyzes the images and controls the CMP system based on analysis of the images.

The control system 108 includes an image analyzer 150 and a control module 156. The image analyzer receives input images 152 from the camera 110. The image analyzer 150 analyzes the input images 152 and generates image classification data 154 based on analysis of the input images 152. The control module 156 receives the image classification data 154. If the image classification data indicates a problem with the CMP head 104 or component of the CMP head 104 such as the retainer ring 132, then the control module 156 can cause the CMP system to pause or stop operation until repairs or replacements can be made.

As described previously, it can be difficult to detect damage to the retainer ring 132 with the human eye. The image analyzer 150 is capable of analyzing input images 152 of the retainer ring 132 with a much higher degree of detail than can the human eye. Due to the machine learning process, which is described in more detail below, the image analyzer 150 is able to detect very small differences between an image of a damaged retainer ring 132 and that image of a non-damaged retainer ring 132. The image analyzer 150 can focus on the areas of the retainer ring 132 where damage is most likely to occur. For example, the image analyzer 150 can analyze images of the interior surface 133 of the retainer ring 132, the area where the interior surface 133 meets the bottom surface 135, the bottom surface 135, or both the interior surface 133 and the bottom surface 135. The image analyzer 150 can be trained to detect damage in any or all of these locations.

In one embodiment, the camera 110 captures images and the image analyzer 150 analyzes the images after each time the CMP head 104 unloads a wafer to the wafer load and unload unit 106. In alternative embodiments, the process of capturing images in analyzing the images is performed only after the retainer ring 132 has surpassed a certain number of CMP processes. Damage is much more likely to occur later in a lifetime of the retainer ring 132 than at the beginning of the lifetime of the retainer ring 132. Accordingly, the control system 108 can conserve processing resources by operating the camera 110 in the image analyzer 150 only after the retainer ring is been used enough times that damage is more likely to occur.

In one embodiment, the image analyzer 150 analyzes the input images 152 by comparing them to reference images 158. The reference images 158 can include images of an undamaged CMP head. The reference images 158 can also include images of a damaged CMP head. The image analyzer 150 can compare the input images 152 to the reference images 158 to determine whether or not the input images 152 represents a damaged CMP head 104. In one embodiment, the image classification data 154 indicates whether the input images 152 correspond to a damaged CMP head 104. In other words, the classification data 154 classifies the input images as either "damaged" or "not damaged".

In one embodiment, the image analyzer 150 is an analysis model trained with a machine learning process. The machine learning process trains the analysis model to correctly classify images of a CMP head (or retainer ring) as being damaged or not damaged. Accordingly, the image analyzer 150 can include a classifier model. The classifier model classifies input images in accordance with a machine learning process.

In one embodiment, the machine learning process is a supervised machine learning process. During the supervised machine learning process, the reference images 158 are used as a training set. The reference images 158 can be labeled as either "damaged" or "not damaged". During the machine learning process, the reference images 158 are fed through the image analyzer 150. The image analyzer 150 classifies the reference images 158 as either "damaged" or "not damaged". The classifications are compared to the labels. After comparison to the labels, parameters of an internal algorithm or function are adjusted and the reference images 150 are again passed through the image analyzer 150. This process is repeated in iterations until the image classifier 150 can reliably generate image classification data 154 that matches the labels on the reference images 158.

In one embodiment, the image analyzer 150 includes a neural network. The neural network includes a plurality of neural layers. The neuron layers correspond to a weighted function. The input images 152 are passed to a first neural layer. The first neural layer processes the input images 152 in accordance with a series of weighted values. The weighted values are determined in iterations during the machine learning process, as described above. The process data is passed to the next neural layer which again processes the data. This process proceeds until a final neural layer outputs classification data 154. The classification data 154 indicates whether the input images correspond to a "damaged" or "not damaged" CMP head.

In one embodiment, the image analyzer 150 includes a convolutional neural network. The convolutional neural network is a deep learning neural network. The convolutional neural network is configured to analyze the input images 152 and classify them as either "damaged" or "non-damaged". The convolutional neural network includes a plurality of convolutional layers, a plurality of rectifier layers, a plurality of pooling layers, and one or more fully connected layers. During operation of the convolutional neural network, a first convolutional layer receives data corresponding to the input image. The input image may be formatted for processing by the convolutional layer prior to reaching the convolutional layer. The first convolutional layer then performs a convolution operation on the input image. The rectifier layer may perform rectifying operations on the data from the first convolution layer. A pooling layer then performs pooling operations on the (rectified) data from the convolution operation. After the pooling operation, the data is passed to a next convolutional layer in the process of convolution, rectification, and pooling operations repeats. This process continues until the data is provided to one or more fully connected layers. Fully connected layers indicate that the layer has the same number of neurons as the previous layer such that each neuron in the fully connected layer is fully connected to a neuron from the previous layer. A final fully connected layer generates image classification data 154. The image classification data 154 classifies the input image as "damaged" or "not damaged".

While some examples of machine learning models and processes have been described above, an image analyzer 150 can include other types of machine learning models, training processes, or other image analysis techniques without departing from the scope of the present disclosure.

The control system 108 can include one or more memories that store software instructions or image analysis algorithms or processing data. The control system 108 can include one or more processors configured to execute instructions or to process input images in accordance with the processing data stored in the memories.

Figure 5:
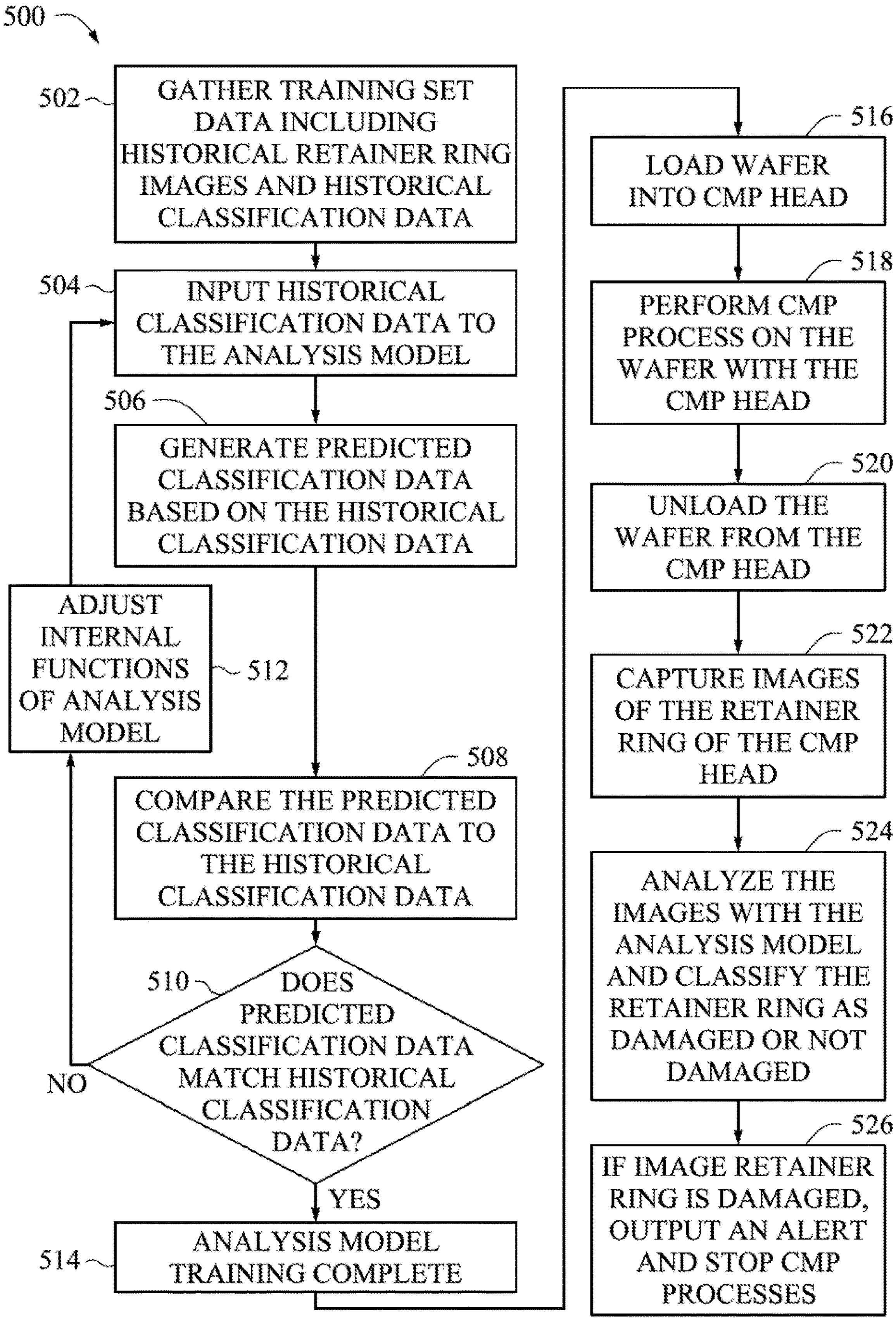
FIG. 5 is a flow diagram of a method for operating a chemical mechanical planarization process, according to one embodiment.

FIG. 5 is a flow diagram of a process 500 for training an analysis model, such as the image analyzer 150 of FIGS. 4, to accurately predict future VOC removal efficiency, according to one embodiment. The various steps of the process 500 can utilize components, processes, and techniques described in relation to FIGS. 1-4. Accordingly, FIG. 5 is described with reference to FIGS. 1-4.

At 502, the process 500 gathers training set data including and historical retainer ring images and historical classification data. This can be accomplished by using a data mining system or process. The data mining system or process can gather training set data by accessing one or more databases associated with the CMP system and collecting images of damaged and undamaged retainer rings. The data mining system or process, or another system or process, can process and format the collected data in order to generate a training set data.

At 504, the process 500 inputs historical retainer ring images to the analysis model of the image analyzer 150. In one example, this can include inputting historical retainer ring images into the analysis model. The historical retainer ring images can be provided in consecutive discrete sets to the analysis model of the image analyzer 150.

At 506, the process 500 generates predicted classification data based on historical retainer ring images. In particular, the analysis model generates, for each set of historical retainer ring images, predicted classification data. The predicted classification data classifies each image as representing either a damaged retainer ring or an undamaged retainer ring.

At 508, the predicted classification data is compared to the historical classification data. In particular, the predicted classification data for each set of historical retainer ring images is compared to the historical classification data associated with that set of historical retainer ring images. The comparison can result in an error function indicating how closely the predicted classification data matches the historical classification data. This comparison is performed for each set of predicted classification data. In one embodiment, this process can include generating an aggregated error function or indication indicating how the totality of the predicted classification data compares to the historical classification data. The comparisons can include other types of functions or data than those described above without departing from the scope of the present disclosure.

At 510, the process 500 determines whether the predicted classification data matches the historical classification data based on the comparisons generated at step 508. In one example, if the aggregate error function is greater than an error tolerance, then the process 500 determines that the predicted classification data does not match the historical classification data. In one example, if the aggregate error function is less than an error tolerance, then the process 500 determines that the predicted classification data does match the historical classification data.

In one embodiment, if the predicted classification data does not match the historical classification data at step 510, then the process proceeds to step 512. At step 512, the process 500 adjusts the internal functions associated with the analysis model. From step 512, the process returns to step 504. At step 504, the historical retainer ring images are again provided to the analysis model. Because the internal functions of the analysis model of the image analyzer 150 have been adjusted, the analysis model will generate different predicted classification data than in the previous cycle. The process proceeds to steps 506, 508 and 510 and the aggregate error is calculated. If the predicted classification data does not match the historical classification data, then the process returns to step 512 and the internal functions of the analysis model of the image analyzer 150 are adjusted again. This process proceeds in iterations until the analysis model of the image analyzer 150 generates predicted classification data that matches the historical classification data.

In one embodiment, if the predicted classification data matches the historical classification data at process step 510, then the process 500, proceeds to 514. At step 514 training is complete. The analysis model of the image analyzer 150 is now ready to be utilized to detect whether a retainer ring is damaged after a CMP process. Steps 502-514 correspond to a machine learning process for the analysis model.

After the analysis model is trained, the process 500 proceeds to 516. At 516, a wafer is loaded into the CMP head 104. The wafer can be loaded into the CMP head one or from a wafer load and unload unit 106, as described previously in relation to FIGS. 1-4. At 518, a CMP system performs a CMP process on the wafer with the CMP head. The CMP process can be performed substantially as described in relation to FIGS. 1 and 2.

At 520, after the CMP process has been performed, the wafer is unloaded from the CMP head 104 into the wafer load and unload unit 106. The wafer can be loaded from the CMP head 104 into the wafer load and unload unit 106 substantially as described in relation to FIGS. 1-4.

At 522, the camera 110 captures images of the retainer ring 132 of the CMP head 104. The camera 110 can capture images of the retainer ring 132 substantially as described in relation to FIGS. 1 to 4.

At 524, the analysis model analyzes the images captured by the camera 110. The analysis model classifies the retainer ring is damaged or not damaged based on the analysis of the images. Because the analysis model has been trained with a machine learning process as described in relation to steps 502-514, the analysis model can reliably determine whether the retainer ring is damaged or not damaged.

At 526, if the retainer ring 132 is damaged, then the control module 156 of the control system 108 outputs an alert indicating that the retainer ring 132 is damaged. The control system 102 also shuts down the CMP process until the retainer ring 132 can be replaced.

The process 500 can include other steps or arrangements of steps than shown and described herein without departing from the scope of the present disclosure.

Figure 6:
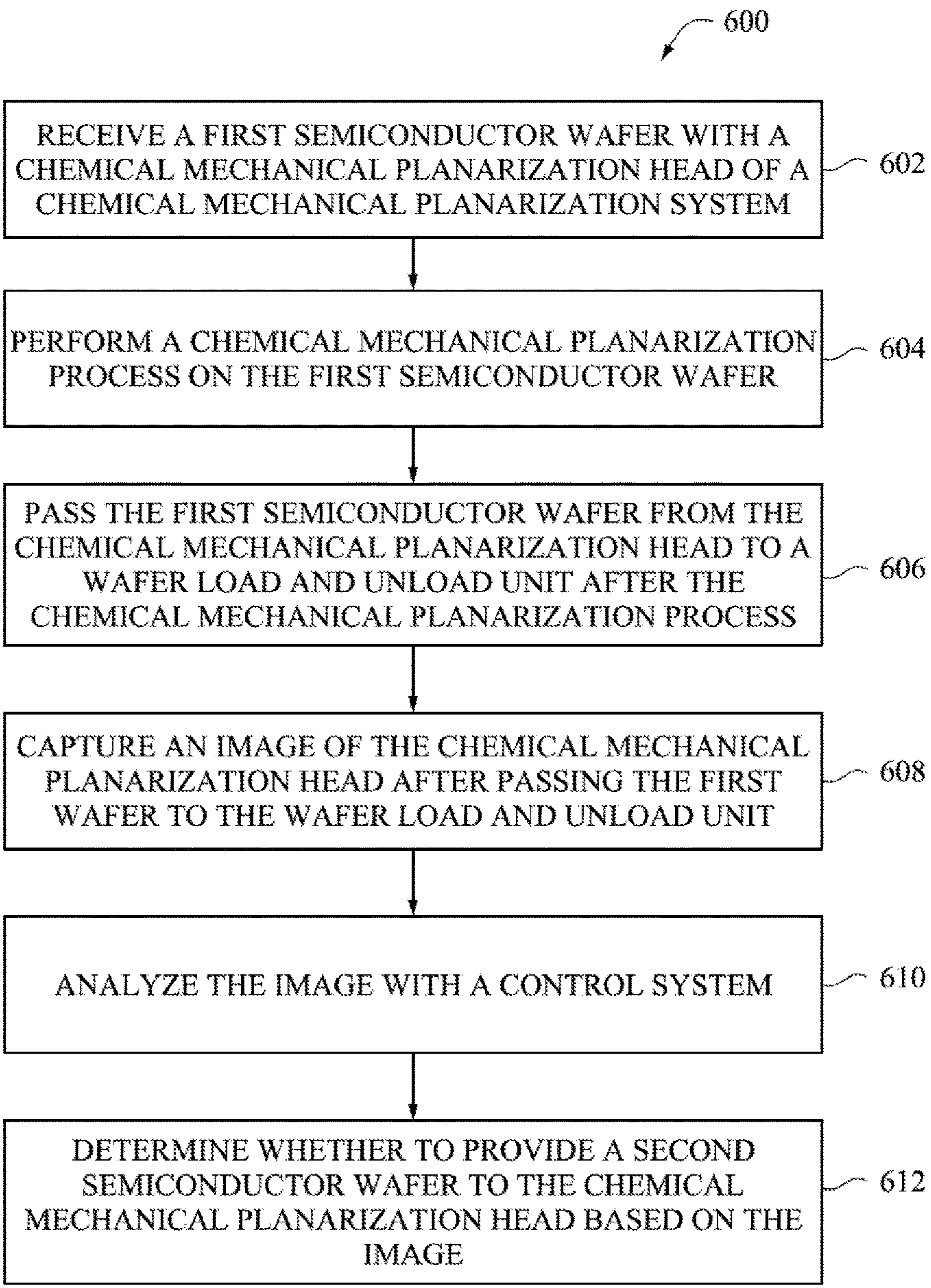
FIG. 6 is a flow diagram of a method for operating a chemical mechanical planarization system, according to one embodiment.

FIG. 6 is a flow diagram of a method 600 for operating a chemical mechanical planarization system, according to one embodiment. At 602, the method 600 includes receiving a first semiconductor wafer with a chemical mechanical planarization head of a chemical mechanical planarization system. One example of a chemical mechanical planarization head is the chemical mechanical planarization head 104 of FIG. 1. At 604, the method 600 includes performing a chemical mechanical planarization process on the first semiconductor wafer. At 606, the method 600 includes passing the first semiconductor wafer from the chemical mechanical planarization head to a wafer load and unload unit after the chemical mechanical planarization process. One example of a wafer load and unload unit is the wafer load and unload unit 106 of FIG. 1. At 608, the method 600 includes capturing an image of the chemical mechanical planarization head after passing the first wafer to the wafer load and unload unit. At 610, the method 600 includes analyzing the image with a control system. One example of a control system is the control system 108 of FIG. 1. At 612, the method 600 includes determining whether to provide a second semiconductor wafer to the chemical mechanical planarization head based on the image.

Figure 7:
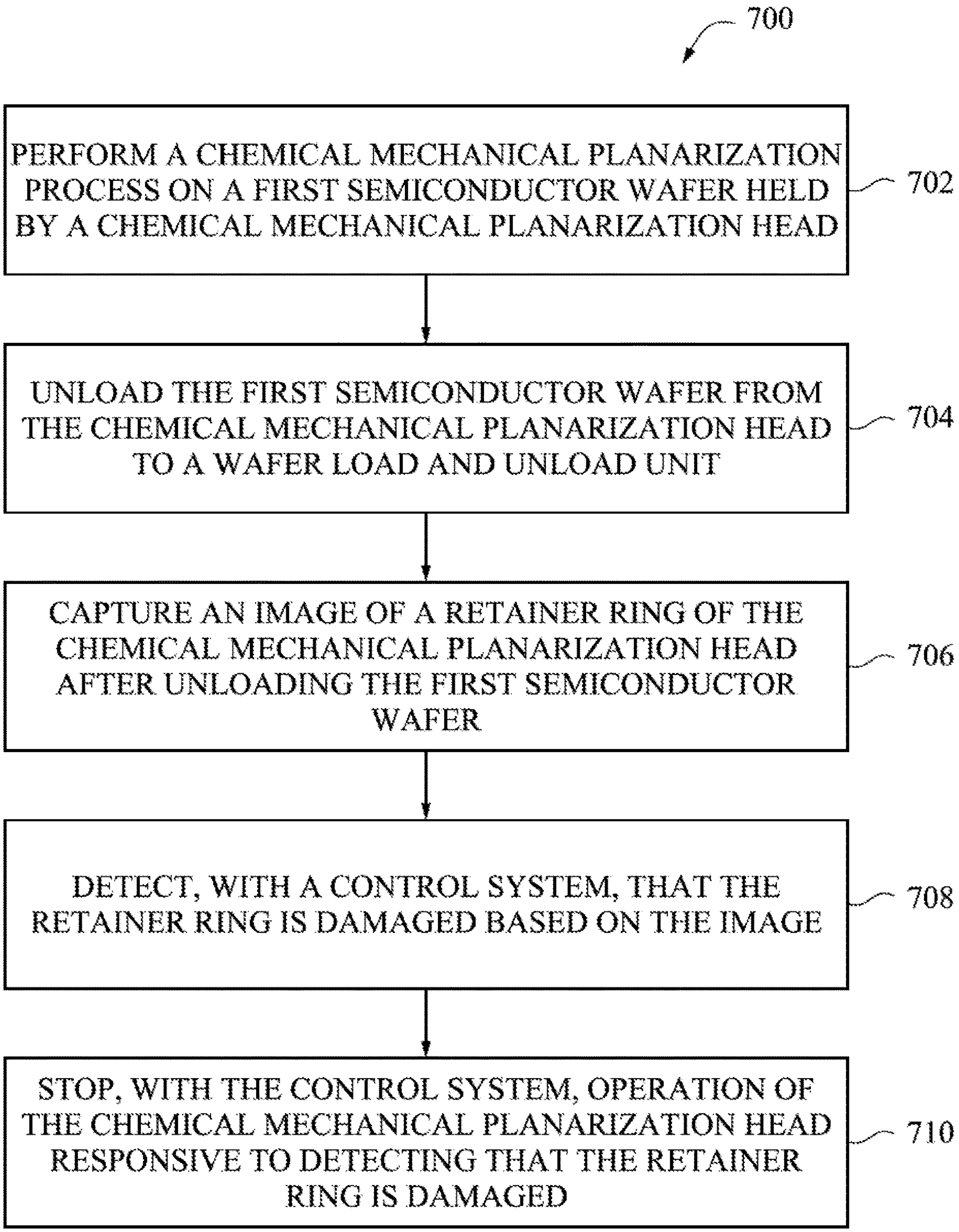
FIG. 7 is a flow diagram of a method for operating a chemical mechanical planarization, according to one embodiment.

FIG. 7 is a flow diagram of a method 700 for operating a CMP system, according to one embodiment. At 702, the method 700 includes performing a chemical mechanical planarization process on a first semiconductor wafer held by a chemical mechanical planarization head. One example of a chemical mechanical planarization head is the chemical mechanical planarization head 104 of FIG. 1. At 704, the method 700 includes unloading the first semiconductor wafer from the chemical mechanical planarization head to a wafer load and unload unit. One example of a wafer load and unload unit is the wafer load and unload unit 106 of FIG. 1. At 706, the method 700 includes capturing an image of a retainer ring of the chemical mechanical planarization head after unloading the first semiconductor wafer. One example of a retainer ring is the retainer ring 132 of FIGS. 3A and 3B. At 708, the method 700 includes detecting, with a control system, that the retainer ring is damaged based on the image. One example of a control system is the control system 108 of FIG. 1. At 710, the method 700 includes stopping, with the control system, operation of the chemical mechanical planarization head responsive to detecting that the retainer ring is damaged.

One embodiment is a method including receiving a first semiconductor wafer with a chemical mechanical planarization head of a chemical mechanical planarization system and performing a chemical mechanical planarization process on the first semiconductor wafer. The method includes passing the first semiconductor wafer from the chemical mechanical planarization head to a wafer load and unload unit after the chemical mechanical planarization process and capturing an image of the chemical mechanical planarization head after passing the first wafer to the wafer load and unload unit. The method includes analyzing the image with a control system and determining whether to provide a second semiconductor wafer to the chemical mechanical planarization head based on the image.

One embodiment is a method including performing a chemical mechanical planarization process on a first semiconductor wafer held by a chemical mechanical planarization head and unloading the first semiconductor wafer from the chemical mechanical planarization head to a wafer load and unload unit. The method includes capturing an image of a retainer ring of the chemical mechanical planarization head after unloading the first semiconductor wafer and detecting, with a control system, that the retainer ring is damaged based on the image. The method includes stopping, with the control system, operation of the chemical mechanical planarization head responsive to detecting that the retainer ring is damaged.

One embodiment is a chemical mechanical planarization system including a chemical mechanical planarization station configured to perform a chemical mechanical planarization process. The system includes a wafer load and unload unit configured to receive a semiconductor wafer. The system includes a chemical mechanical planarization head configured to receive the semiconductor wafer from the wafer load and unload unit, to carry the semiconductor wafer to the chemical mechanical planarization station for the chemical mechanical planarization process, and to return the semiconductor wafer to the wafer load and unload unit. The system includes a camera configured to capture an image of the chemical mechanical planarization head after the chemical mechanical planarization head has returned the semiconductor wafer to the wafer load and unload unit. The system includes a control system configured to receive the image, to analyze the image with an image analysis process, to generate a classification of the image, and to control the chemical mechanical planarization head responsive to the classification.

Embodiments of the present disclosure provide many benefits over traditional chemical mechanical planarization systems. Embodiments of the present disclosure utilize an image capturing system and machine learning techniques to detect damage or other flaws in chemical mechanical planarization equipment before the equipment can damage a semiconductor wafer. Embodiments of the present disclosure reduce the need for technicians or experts to stop operation of the chemical mechanical planarization equipment in order to manually inspect chemical mechanical planarization equipment. Instead, the image capture system and machine learning modules can detect damaged equipment during operation and can automatically stop operation if damage is detected. The result is that fewer resources are utilized in inspecting and operating chemical mechanical planarization equipment. Furthermore, fewer expensive semiconductor wafers will need to be scrapped due to damaged chemical mechanical planarization equipment.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

receiving a first semiconductor wafer with a chemical mechanical planarization head of a chemical mechanical planarization system;

performing a chemical mechanical planarization process on the first semiconductor wafer;

passing the first semiconductor wafer from the chemical mechanical planarization head to a wafer load and unload unit after the chemical mechanical planarization process, wherein the wafer load and unload unit includes a shelf configured to support the first semiconductor wafer when the first semiconductor wafer is unloaded to the wafer load and unload unit, wherein the wafer load and unload unit includes a recess in a bottom interior surface such that when the first semiconductor wafer is supported on the shelf the recess is directly below the first semiconductor wafer;

positioning a camera in the recess of the wafer loading and unloading unit such that the camera is positioned at an angle θ relative to a vertical line, wherein θ is greater than 0° and less than 90°;

determining whether the retainer ring has been used more than a threshold number of uses;

if the retainer ring has not been used more than the threshold number of uses, preventing activation of the camera;

if the retainer ring has been used more than the threshold number of uses, after passing the first wafer to the wafer load and unload unit, activating the camera including pivoting, via a control system, the camera through a plurality of positions to capture a plurality of first images along the entire inner circumference of a retainer ring of the chemical mechanical planarization head;

analyzing the first plurality of first images with the control system; and determining whether to provide a second semiconductor wafer to the chemical mechanical planarization head based on the plurality of first images.

2. The method of claim 1, further comprising:

generating a classification of the plurality of first images with the control system, wherein the classification indicates whether or not the chemical mechanical planarization head is damaged; and determining whether to provide the second semiconductor wafer to the chemical mechanical planarization head based on the classification.

3. The method of claim 1, further comprising preventing, with the control system, the chemical mechanical planarization head from receiving the second semiconductor wafer if the classification indicates that the retainer ring is damaged.

4. The method of claim 1, wherein determining whether to provide the second semiconductor wafer to the chemical mechanical planarization head includes determining whether or not the retainer ring is damaged.

5. The method of claim 4, further comprising generating the classification with a convolutional neural network of the control system.

6. The method of claim 4, wherein capturing the plurality of first images of the retainer ring includes capturing an image of an interior surface of the retainer ring.

7. The method of claim 1, further comprising:

capturing a plurality of second images with a plurality of cameras comprising the camera and one or more additional cameras;

analyzing the second plurality of images with the plurality of cameras; and determining whether or not to provide the second semiconductor wafer to the chemical mechanical planarization head based on the plurality of second images.

8. The method of claim 1, wherein analyzing the plurality of first images includes comparing the plurality of first images to one or more reference images.

9. A method, comprising:

performing a chemical mechanical planarization process on a first semiconductor wafer held by a chemical mechanical planarization head;

unloading the first semiconductor wafer from the chemical mechanical planarization head to a wafer load and unload unit, wherein the wafer load and unload unit includes a shelf configured to support the first semiconductor wafer when the first semiconductor wafer is unloaded to the wafer load and unload unit, wherein the wafer load and unload unit includes a recess in a bottom interior surface such that when the first semiconductor wafer is supported on the shelf the recess is directly below the first semiconductor wafer;

placing a camera in the recess of the wafer loading and unloading unit such that the camera is positioned at an angle θ relative to a vertical line, wherein θ is greater than 0° and less than 90°, wherein the recess is located in the wafer loading and unloading unit such that when a wafer is held by the loading and unloading unit the camera is directly below the wafer;

capturing an image, with the camera positioned at the angle θ, of a retainer ring of the chemical mechanical planarization head after unloading the first semiconductor wafer;

detecting, with a control system, that the retainer ring is damaged based on the image; and stopping, with the control system, operation of the chemical mechanical planarization head responsive to detecting that the retainer ring is damaged.

10. The method of claim 9, further comprising training an image analyzer of the control system with a machine learning process to identify damage to the retainer ring.

11. The method of claim 10, wherein the machine learning process includes utilizing a plurality of reference images of retainer rings as a training set.

12. The method of claim 11, wherein the image analyzer includes a convolutional neural network.

13. A method, comprising:

receiving a semiconductor wafer with a wafer load and unload unit of a chemical mechanical planarization system, wherein the wafer load and unload unit includes a shelf configured to support the semiconductor wafer when the semiconductor wafer is received with the wafer load and unload unit, wherein the wafer load and unload unit includes a recess in a bottom interior surface such that when the semiconductor wafer is supported on the shelf the recess is directly below the semiconductor wafer;

receiving the semiconductor wafer from the wafer load and unload unit with a chemical mechanical planarization head;

performing a chemical mechanical planarization process on the semiconductor wafer while holding the semiconductor wafer with the chemical mechanical planarization head;

returning the chemical mechanical planarization head to a position above the wafer load and unload unit after performing the chemical mechanical planarization process;

positioning a camera in the recess of the wafer loading and unloading unit such that the camera is positioned at an angle θ relative to a vertical line, wherein θ is greater than 0° and less than 90°;

determining, with a control system, whether the retainer ring has been used more than a threshold number of uses;

if the retainer ring has not been used more than the threshold number of uses, preventing activation of the camera;

if the retainer ring has been used more than the threshold number of uses, after returning the first semiconductor wafer to the wafer handling unit, using the control system to activate the camera and pivot the camera through a plurality of positions to capture a plurality of images over an entire inner circumference of a retainer ring of the chemical mechanical planarization head;

analyzing, with the control system, the plurality of images with an image analysis process;

generating, with the control system, a classification of the plurality of images; and controlling, with the control system, the chemical mechanical planarization head responsive to the classification.

14. The method of claim 13, wherein the retainer ring is configured to laterally retain the semiconductor wafer when the chemical mechanical planarization head holds the semiconductor wafer.

15. The method of claim 14, wherein the classification indicates whether or not the retainer ring is damaged.

16. The method of claim 15, further comprising preventing, with the control system, the chemical mechanical planarization head from receiving a next semiconductor wafer if the classification indicates that the retainer ring is damaged.

17. The method of claim 16, further comprising permitting, with the control system, the chemical mechanical planarization head to receive the next semiconductor wafer if the retainer ring is not damaged.

18. The method of claim 13, wherein the camera is positioned adjacent to the wafer load and unload unit.

19. The method of claim 13, further comprising generating the classification with an image analyzer of the control system that implements a convolutional neural network.

20. The method of claim 13, further comprising generating the classification with a machine learning based image analyzer of the control system.

* * * * *